(12) United States Patent
Kameda et al.

(10) Patent No.: US 8,570,056 B2
(45) Date of Patent: Oct. 29, 2013

(54) SEMICONDUCTOR INSPECTION APPARATUS, SEMICONDUCTOR WAFER POSITIONING METHOD, AND SEMICONDUCTOR WAFER INSPECTION METHOD

(75) Inventors: Yoshio Kameda, Tokyo (JP); Masamoto Tago, Tokyo (JP); Yoshihiro Nakagawa, Tokyo (JP); Koichiro Noguchi, Tokyo (JP)

(73) Assignee: NEC Corporation, Tokyo (JP)

( * ) Notice: Subject to any disclaimer, the term of this patent is extended or adjusted under 35 U.S.C. 154(b) by 388 days.

(21) Appl. No.: 12/866,223

(22) PCT Filed: Feb. 26, 2009

(86) PCT No.: PCT/JP2009/053589
§ 371 (c)(1),
(2), (4) Date: Aug. 4, 2010

(87) PCT Pub. No.: WO2009/107741
PCT Pub. Date: Sep. 3, 2009

(65) Prior Publication Data
US 2010/0321053 A1    Dec. 23, 2010

(30) Foreign Application Priority Data
Feb. 28, 2008    (JP) ................. 2008-047735

(51) Int. Cl.
*G01R 31/00*    (2006.01)
*G01R 31/02*    (2006.01)

(52) U.S. Cl.
USPC .................... 324/750.16; 324/537

(58) Field of Classification Search
None
See application file for complete search history.

(56) References Cited

U.S. PATENT DOCUMENTS

| | | | |
|---|---|---|---|
| 6,765,400 B2 * | 7/2004 | Ido ............................ | 324/756.03 |
| 7,378,860 B2 * | 5/2008 | Volkerink et al. ......... | 324/754.07 |
| 7,723,213 B2 * | 5/2010 | Ichikawa ....................... | 438/464 |
| 7,994,026 B2 * | 8/2011 | Harikai et al. ................ | 438/464 |
| 2001/0047496 A1 * | 11/2001 | Hidaka et al. ..................... | 714/5 |
| 2004/0012405 A1 * | 1/2004 | Cheng et al. ................... | 324/761 |
| 2004/0207425 A1 * | 10/2004 | Ido .................................. | 324/760 |
| 2008/0297185 A1 * | 12/2008 | Kang et al. ..................... | 324/754 |
| 2010/0321054 A1 * | 12/2010 | Kameda et al. ............ | 324/754.07 |

FOREIGN PATENT DOCUMENTS

| | | |
|---|---|---|
| JP | 60-201639 | 10/1985 |
| JP | 2000269278 A | 9/2000 |
| JP | 2004253561 A | 9/2004 |
| JP | 3798716 B | 7/2006 |
| WO | 2006104121 A | 10/2006 |

OTHER PUBLICATIONS

International Search Report for PCT/JP2009/053589 mailed Mar. 24, 2009.

* cited by examiner

*Primary Examiner* — Jermele M Hollington

(57) ABSTRACT

A semiconductor inspection apparatus comprising: a plurality of wafer stages, provided independently for each of a plurality of laminated semiconductor wafers, that directly or indirectly secure the corresponding semiconductor wafers and that possess a mechanism for positioning the corresponding semiconductor wafers; and a probe card, arranged outside or in between the plurality of laminated semiconductor wafers so as to face the semiconductor wafers, that transmits a signal or power to the plurality of semiconductor wafers.

16 Claims, 17 Drawing Sheets

SEMICONDUCTOR INSPECTION APPARATUS, SEMICONDUCTOR WAFER POSITIONING METHOD, AND SEMICONDUCTOR WAFER INSPECTION METHOD

REFERENCE TO RELATED APPLICATION

The present invention is the National Phase of PCT/JP2009/053589, filed Feb. 26, 2009, which is based upon and claims the benefit of the priority of Japanese patent application No. 2008-047735 filed on Feb. 28, 2008, the disclosure of which is incorporated herein in its entirety by reference thereto.

TECHNICAL FIELD

The present invention relates to a semiconductor inspection apparatus, and semiconductor wafer inspection method that inspect a semiconductor wafer, and particularly to a semiconductor inspection apparatus, semiconductor wafer positioning method, and semiconductor wafer inspection method that inspect a plurality of semiconductor wafers simultaneously.

BACKGROUND

A conventional semiconductor inspection apparatus inspecting a semiconductor wafer generally uses a contact-type method in which an inspection is performed by having a probe pin contact a pad on a semiconductor wafer, however, in recent years, non-contact-type methods in which an inspection is performed by means of wireless communication with subject chips in a semiconductor wafer without contacting them has been used since the semiconductor wafer may get damaged or it is difficult to adjust the contact pressure in the contact-type method.

For instance, Patent Document 1 discloses a non-contact signal transmission method using wireless communication that performs inspection by using semiconductor chips (the subject chips) having communication coils formed therein in a semiconductor wafer, wirelessly transmitting an inspection signal from the head of the semiconductor inspection apparatus to the communication coils, and transmitting the inspection results from the communication coils to the head after the functions of the semiconductor chips receiving the inspection signal have been inspected. In this method, each semiconductor chip in the semiconductor wafer is inspected by moving the head or the semiconductor wafer.

Meanwhile, Patent Document 2 discloses a wafer inspection apparatus using non-contact signal transmission that comprises a data transmitting/receiving unit that faces a subject wafer in a non-contact state and a tester connected to the data transmitting/receiving unit, starts an inspection when the subject wafer receives an inspection signal from the data transmitting/receiving unit, and has the subject wafer transmit the inspection results to the data transmitting/receiving unit after the inspection is completed.

However, since the conventional methods can inspect only one semiconductor wafer at a time and cannot simultaneously inspect chips more than the number of chips formed in a semiconductor wafer, these methods are limited in terms of reducing the inspection time per chip. Meanwhile, the number of chips inspected simultaneously can be increased by having a plurality of semiconductor inspection apparatuses operate in parallel, however, adding more semiconductor inspection apparatuses will increase the cost.

Patent Document 3 discloses a method for reducing inspection costs in which the inspection time per chip is reduced by increasing the number of chips inspected simultaneously. The technology described in Patent Document 3 is a burn-in apparatus that holds a plurality of semiconductor wafers in a wafer holder and presses electrode chips to wires formed in peripheral edge zones of semiconductor wafers, and according to this burn-in apparatus, a plurality of semiconductor wafers can be screened simultaneously by electrically contacting the plurality of semiconductor wafers.
[Patent Document 1]
Japanese Patent No. 379871613
[Patent Document 2]
Japanese Patent Kokai Publication No. JP2004-253561A
[Patent Document 3]
Japanese Patent Kokai Publication No. JP2000-269278A

SUMMARY

The entire disclosures of Patent Documents 1 to 3 are incorporated herein by reference thereto. The following analysis is given by the present invention.

Although a plurality of semiconductor wafers can be inspected simultaneously according to Patent Document 3, it may not be possible to inspect all the chips formed in a semiconductor wafer simultaneously since the electrodes are formed in peripheral edge zones of semiconductor wafers and the number of the electrodes per semiconductor wafer is limited. Further, since the function of positioning each semiconductor wafer is not provided in Patent Document 3, it may not be possible to position the electrode chips to the wires in the peripheral edge zone of each semiconductor wafer.

It is a main object of the present invention to reduce the inspection cost per chip without installing additional equipment.

In a first aspect of the present invention, a semiconductor inspection apparatus inspecting a semiconductor wafer comprises; a plurality of wafer stages, provided independently for each of a plurality of laminated semiconductor wafers, that directly or indirectly secure the corresponding semiconductor wafers and that possess a mechanism for positioning the corresponding semiconductor wafers: and a probe card, arranged outside or in between the plurality of laminated semiconductor wafers so as to face the semiconductor wafers, that transmits a signal or power to the plurality of semiconductor wafers.

In a second aspect of the present invention, a semiconductor wafer positioning method comprises a step of positioning a plurality of semiconductor wafers laminated with each other and secured by each of a plurality of wafer stages independently capable of positioning, relative to probe card provided outside or in between the plurality of semiconductor wafers so as to face the semiconductor wafers for each of the semiconductor wafers.

In a third aspect of the present invention, a semiconductor wafer inspection method comprises a step of positioning a plurality of semiconductor wafers laminated with each other and secured by each of a plurality of wafer stages independently capable of positioning relative to a probe card provided outside or in between the plurality of semiconductor wafers so as to face the semiconductor wafers for each of the semiconductor wafers; a step of having the probe card simultaneously transmit an inspection signal to subject chips provided in each of the semiconductor wafers; and a step of having each of the subject chips that have received the inspection signal simultaneously transmit the respective inspection result to the probe card.

In a fourth aspect of the present invention, a semiconductor apparatus manufacturing method comprises the step or steps in the semiconductor wafer positioning method or the semiconductor wafer inspection method.

According to the present invention, since an independent wafer stage is provided for each semiconductor wafer and each of the wafer stages is independently capable of relative positioning, the number of chips simultaneously inspected can be increased and the inspection time per chip can be reduced without increasing the number of inspection apparatuses. As a result, the inspection cost can be reduced. Further, the size of the inspection apparatus per wafer can be reduced. Moreover, it becomes possible to have multichannel test input/output.

PREFERRED MODES

Figure 1:
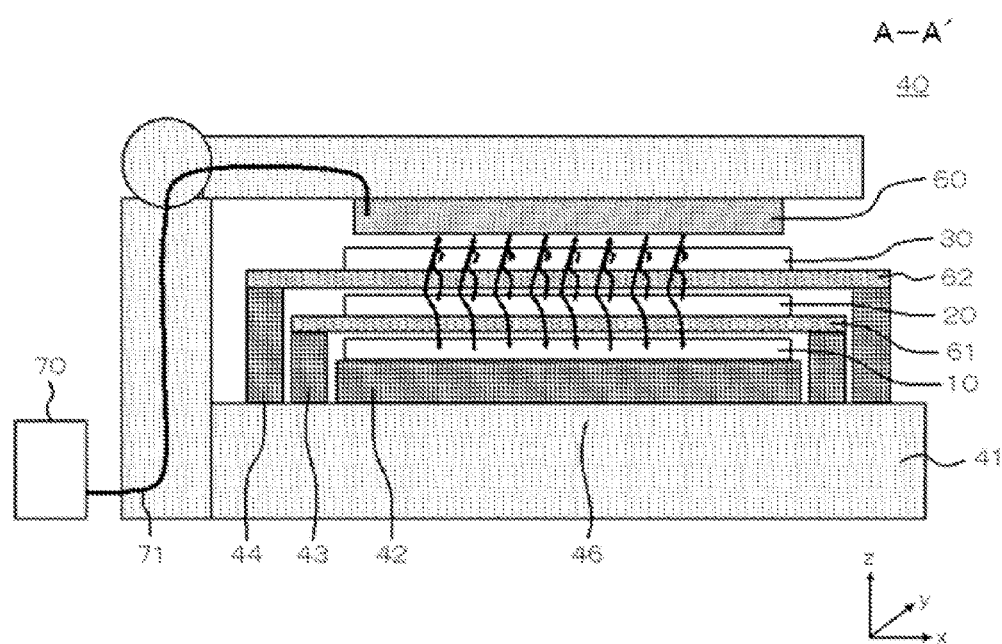
FIG. 1 is a cross-section along line A-A' in FIG. 2, schematically showing the configuration of a semiconductor inspection apparatus relating to Example 1 of the present invention.

A semiconductor inspection apparatus relating to a mode of the present invention comprises a plurality of wafer stages (42, 43, and 44 in FIG. 1), provided independently for each of a plurality of laminated semiconductor wafers (10, 20, and 30 in FIG. 1), that directly or indirectly secure the corresponding semiconductor wafers (10, 20, and 30 in FIG. 1) and that possess a mechanism for positioning the corresponding semiconductor wafers (10, 20, and 30 in FIG. 1), and a probe card (50 in FIG. 1), arranged outside or in between the plurality of laminated semiconductor wafers (10, 20, and 30 in FIG. 1) so as to face the semiconductor wafers (10, 20, and 30 in FIG. 1), that sends signals or power to the plurality of semiconductor wafers (10, 20, and 30 in FIG. 1) (Mode 1).

Further, other modes below are possible.

It is preferable that a plurality of subject chips be formed in the semiconductor wafers, and that the probe card comprise one or more inspecting chips capable of performing non-contact transmission to the subject chips in the semiconductor wafers (Mode 1-1).

It is preferable that the subject chip include at least one non-contact transmission electrode that performs non-contact transmission of a signal or power, and that the inspecting chip include at least one non-contact transmission electrode that performs non-contact transmission of a signal or power to the non-contact transmission electrode of the subject chip (Mode 1-2).

It is preferable that the non-contact transmission electrode be a communication coil (Mode 1-3).

It is preferable that a sheet to which a predetermined semiconductor wafer of the semiconductor wafers is detachably adhered be provided, and that a predetermined wafer stage of the wafer stages be able to secure the sheet thereon (Mode 1-4).

It is preferable that the sheet be a dicing sheet (Mode 1-5).

It is preferable that a predetermined wafer stage of the wafer stages be able to secure the sheet thereon by suction (Mode 1-6).

It is preferable that the plurality of wafer stages of the semiconductor inspection apparatus be fixed on a common base, and that the probe card be embedded in the wafer stage that secures the semiconductor wafer closest to the base (Mode 1-7).

It is preferable that the plurality of wafer stages of the semiconductor inspection apparatus be fixed on a common base, and that the probe card be disposed inside the wafer stage that secures the semiconductor wafer closest to the base (Mode 1-8).

It is preferable that the plurality of wafer stages of the semiconductor inspection apparatus be fixed on a common base, and that a wafer stage that supports a semiconductor wafer on the side of the base out of two adjacent semiconductor wafers of the plurality of semiconductor wafers of the semiconductor inspection apparatus be disposed inside a wafer stage that supports the other semiconductor wafer (Mode 1-9).

It is preferable that the semiconductor wafer have a wafer electrode electrically connected to each of the subject chips in a region where the subject chip is not disposed, and that the sheet have a sheet electrode that contacts the wafer electrode at a position where the sheet electrode faces the wafer electrode (Mode 1-10).

It is preferable that a pressing member that presses the wafer electrode of the semiconductor wafer furthest from the base and the sheet electrode contacting the wafer electrode of the semiconductor wafer furthest from the base to the side of the base be further provided (Mode 1-11).

It is preferable that an insulating sheet interposed between the probe card and the semiconductor wafer that face each other be provided (Mode 1-12).

It is preferable that the semiconductor wafer have a wafer electrode electrically connected to each of the subject chips (chips to be tested) in a region where the subject chip is not disposed, and that the insulating sheet have a sheet electrode that contacts the wafer electrode at a position where the sheet electrode faces the wafer electrode (Mode 1-13).

It is preferable that each of the semiconductor wafers be of the same type as each other (Mode 1-14).

A semiconductor inspection method relating to a mode of the present invention comprises: a step of positioning a plurality of semiconductor wafers (10, 20, and 30 in FIG. 1) laminated with each other and secured by each of a plurality of wafer stages (42, 43, and 44 in FIG. 1) independently capable of positioning; and a probe card (50 in FIG. 1) provided outside or in between the plurality of semiconductor wafers (10, 20, and 30 in FIG. 1) so as to face the semiconductor wafers (10, 20, and 30 in FIG. 1) for each of the semiconductor wafers (10, 20, and 30 in FIG. 1); a step of having the probe card (50 in FIG. 3) simultaneously transmit an inspection signal to subject chips (11, 21, and 31 in FIG. 1) provided in each of the semiconductor wafers (10, 20, and 30 in FIG. 2); and a step of having each of the subject chips (11, 21, and 31 in FIG. 1) that have received the inspection signal simultaneously transmit the respective inspection result to the probe card (50 in FIG. 3) (Mode 2).

Further, other modes below are possible.

It is preferable that the positioning be performed based on non-contact transmission electrodes provided in each of the plurality of semiconductor wafers and in the probe card (Mode 2-1).

A semiconductor wafer inspection method relating to a mode of the present invention comprises: a step (a) of positioning a plurality of semiconductor wafers laminated with each other and secured by each of a plurality of wafer stages independently capable of positioning relative to a probe card provided outside or in between the plurality of semiconductor wafers so as to face the semiconductor wafers for each of the semiconductor wafers; a step (b) of having the probe card simultaneously transmit an inspection signal to subject chips provided in each of the semiconductor wafers; and a step (c) of having each of the subject chips that have received the inspection signal simultaneously transmit the respective inspection result to the probe card (Mode 3).

Further, other modes below are possible.

It is preferable that the step (b) and the step (c) be performed with non-contact transmission between an inspecting chip provided in the probe card and the subject chip(s) (Mode 3-1).

A semiconductor apparatus manufacturing method relating to a mode of the present invention comprises the step or steps in the semiconductor inspection method or the semiconductor wafer inspection method (Mode 4).

Example 1

Figure 2:
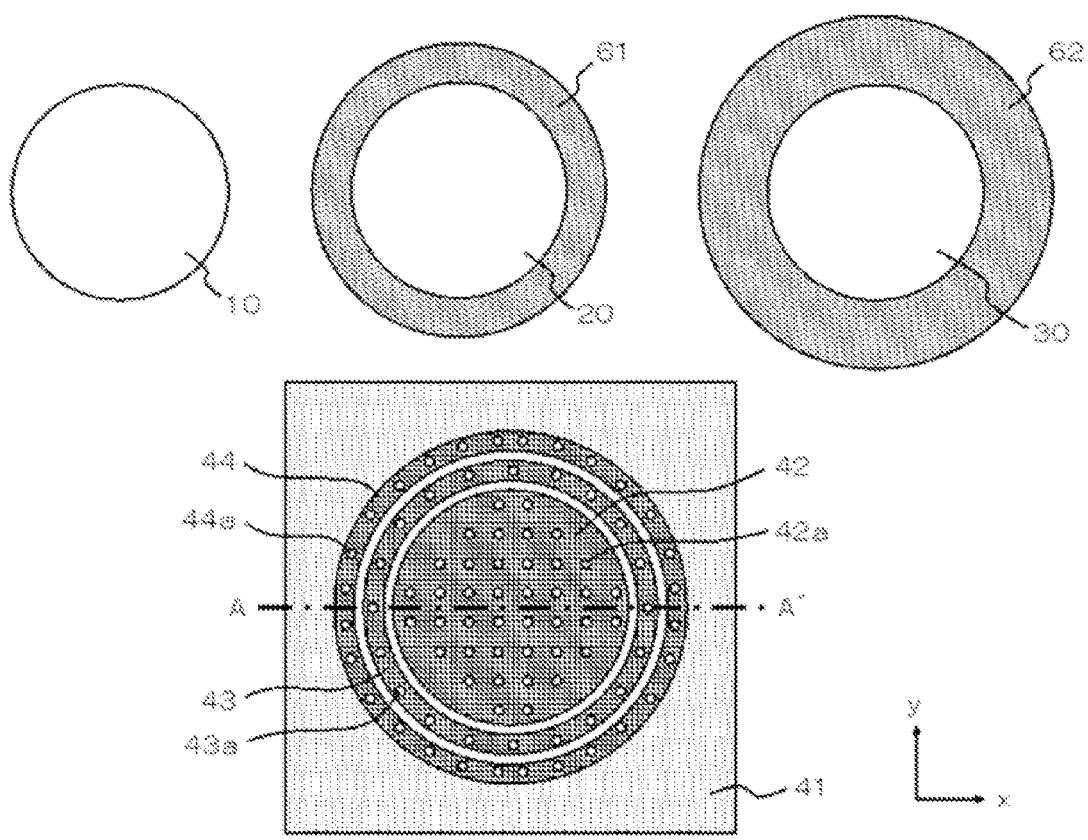
FIG. 2 is a developed plan schematically showing the configuration of the semiconductor inspection apparatus relating to Example 1 of the present invention.

A semiconductor inspection apparatus relating to Example 1 of the present invention will be described with reference to the drawings. FIG. 1 is a cross-section along line A-A' in FIG. 2, schematically showing the configuration of the semiconductor inspection apparatus relating to Example 1 of the present invention. FIG. 2 is a developed plan view schematically showing the configuration of the semiconductor inspection apparatus relating to Example 1 of the present invention. Note that the head of a prober 41 is not shown in FIG. 2.

With reference to FIGS. 1 and 2, the semiconductor inspection apparatus 40 is an apparatus capable of simultaneously inspecting a plurality of semiconductor wafers 10, 20, and 30 (three in the drawing). The semiconductor inspection apparatus 40 comprises a prober 41, a first wafer stage 42, a second wafer stage 43, a third wafer stage 44, a probe card 50, a first sheet 61, and a second sheet 62.

The prober 41 is a portion in which a base that holds the first wafer stage 42, the second wafer stage 43, and the third wafer stage 44, and the head that holds the probe card 50 are notably (or pivotably) coupled.

The first wafer stage 42 is a stage that holds the first semiconductor wafer 10 disposed underneath the second semiconductor wafer 20 (the lowest level). The first wafer stage 42 is disposed inside the second wafer stage 43 and fixed on the top of the base of the prober 41. As a mechanism of positioning the first semiconductor wafer 10, the first wafer stage 42 moves in the x-, y-, and z-axis directions, rotates in the x-y plane, and tilts in the x-y plane. The first wafer stage 42 comprises vacuum suction means (a sucking port 42a in FIG. 2) for fixing the first semiconductor wafer 10 on the stage.

The second wafer stage 43 is a stage that holds the second semiconductor wafer 20 disposed between the first semiconductor wafer 10 and the third semiconductor wafer 30 (the middle level) via the first sheet 61. The second wafer stage 43 is disposed inside the third wafer stage 44 and outside the first wafer stage 42, and is fixed on the top of the base of the prober 41. As a mechanism of positioning the second semiconductor wafer 20, the second wafer stage 43 moves in the x-, y-, and z-axis directions, rotates in the x-y plane, and tilts of (relative to) the x-y plane. The second wafer stage 43 comprises vacuum suction means (sucking ports 43a in FIG. 2) for fixing the second semiconductor wafer 20 (the first sheet 61) on the stage.

The third wafer stage 44 is a stage that holds the third semiconductor wafer 30 disposed on top of the second semiconductor wafer 20 (the highest level) via the second sheet 62. The third wafer stage 44 is disposed outside the second wafer stage 43 and fixed on the top of the base of the prober 41. As a mechanism of positioning the third semiconductor wafer 30, the third wafer stage 44 moves in the x-, y-, and z-axis directions, rotates in the x-y plane, and tilts of (relative to) the x-y plane. The third wafer stage 44 comprises vacuum suction means (sucking ports 44a in FIG. 2) for fixing the third semiconductor wafer 30 (the second sheet 62) on the stage.

The probe card 50 is a card-shaped component (member) that comprises a function of performing non-contact transmission of power or a signal or both to the semiconductor wafers 10, 20, and 30 typically having a communication coil that performs non-contact communication using the principle of electromagnetic induction. The probe card 50 is fixed on the head of the prober 41. The probe card 50 is electrically connected to a tester 70 via a wiring 71 provided in the prober 41. The configuration of the probe card 50 will be described in detail later.

The first sheet 61 is an adapter that holds the second semiconductor wafer 20 on the second wafer stage 43. The first sheet 61 is constituted by an insulating material (for instance a dicing sheet). The second semiconductor wafer 20 is detachably adhered to the center area of a face of the first sheet 61 on the side of the probe card 50. The periphery of a face of the first sheet 61 opposite to the side of the probe card 50 is secured to the second wafer stage 43 by vacuum suction.

The second sheet 62 is an adapter that holds the third semiconductor wafer 30 on the third wafer stage 44. The second sheet 62 is constituted by an insulating material (for instance a dicing sheet), and at least a part of the second sheet 62 is formed larger than the first sheet 61. The third semiconductor wafer 30 is detachably adhered to the center area of a face of the second sheet 62 on the side of the probe card 50. The periphery of a face of the second sheet 62 opposite to the side of the probe card 50 is secured to the third wafer stage 44 by vacuum suction.

The first semiconductor wafer 10 is a semiconductor wafer disposed underneath the second semiconductor wafer 20, and is held on top of the first wafer stage 42. The second semiconductor wafer 20 is a semiconductor wafer disposed between the first semiconductor wafer 10 and the third semiconductor wafer 30, and is held on top of the second wafer stage 43 via the first sheet 61. The third semiconductor wafer 30 is a semiconductor wafer disposed above the second semiconductor wafer 20, and is held on top of the third wafer stage 44 via the second sheet 62. The first semiconductor wafer 10, the second semiconductor wafer 20, and the third semiconductor wafer 30 may not have to be of the same size. The first, the second, and the third semiconductor wafers 10, 20, and 30 have a function of performing non-contact communication with the probe card 50 typically comprising a communication coil that performs non-contact communication using the principle of electromagnetic induction. The detailed configurations of the semiconductor wafers 10, 20, and 30, and the operation during inspection will be described later.

The tester 70 is a device that performs testing on the semiconductor wafers 10, 20, and 30 via the probe card 50. The operation of the tester 70 will be described later.

Figure 3:
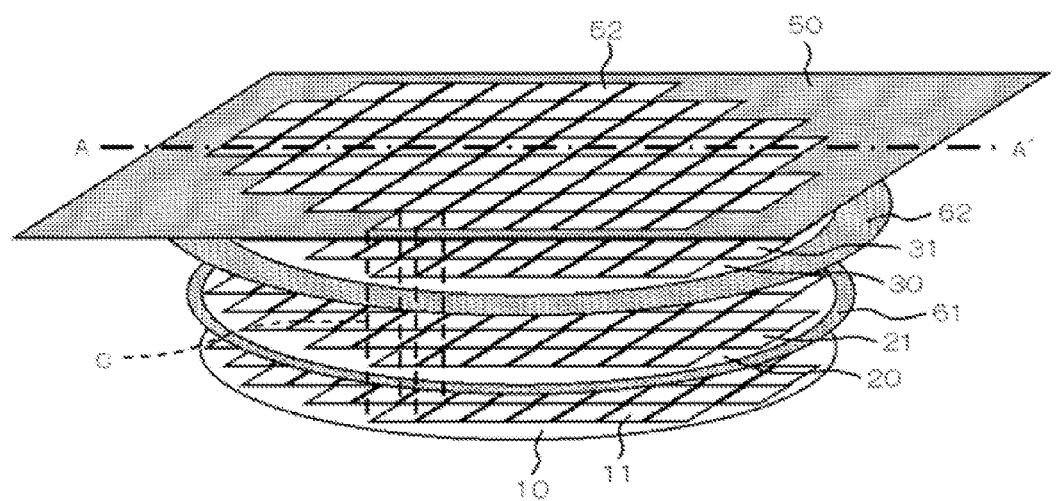
FIG. 3 is a perspective schematically showing the configuration of a probe card and semiconductor wafers in the semiconductor inspection apparatus relating to Example 1 of the present invention.
Figure 4:
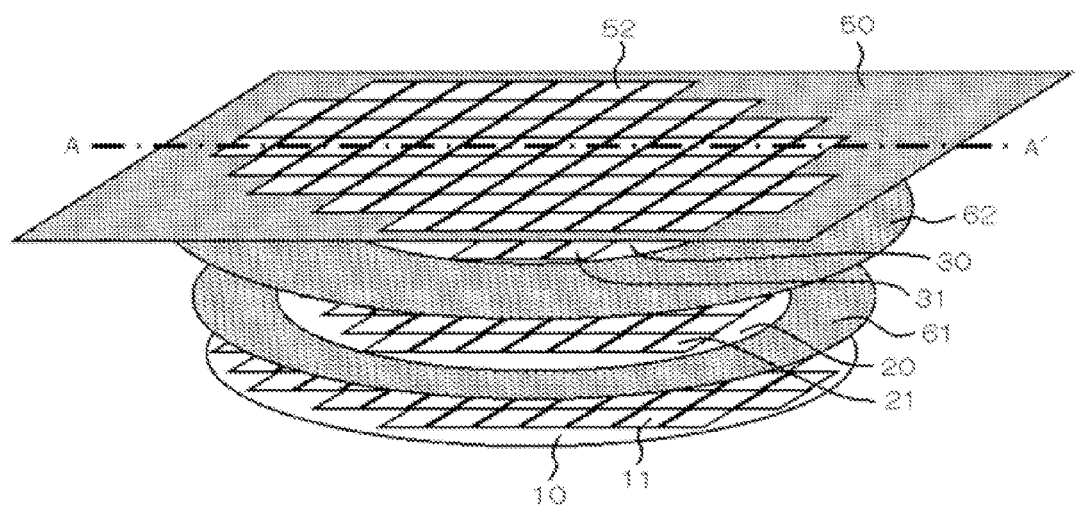
FIG. 4 is a perspective schematically showing a variation of the configuration of the probe card and the semiconductor wafers in the semiconductor inspection apparatus relating to Example 1 of the present invention.
Figure 5:
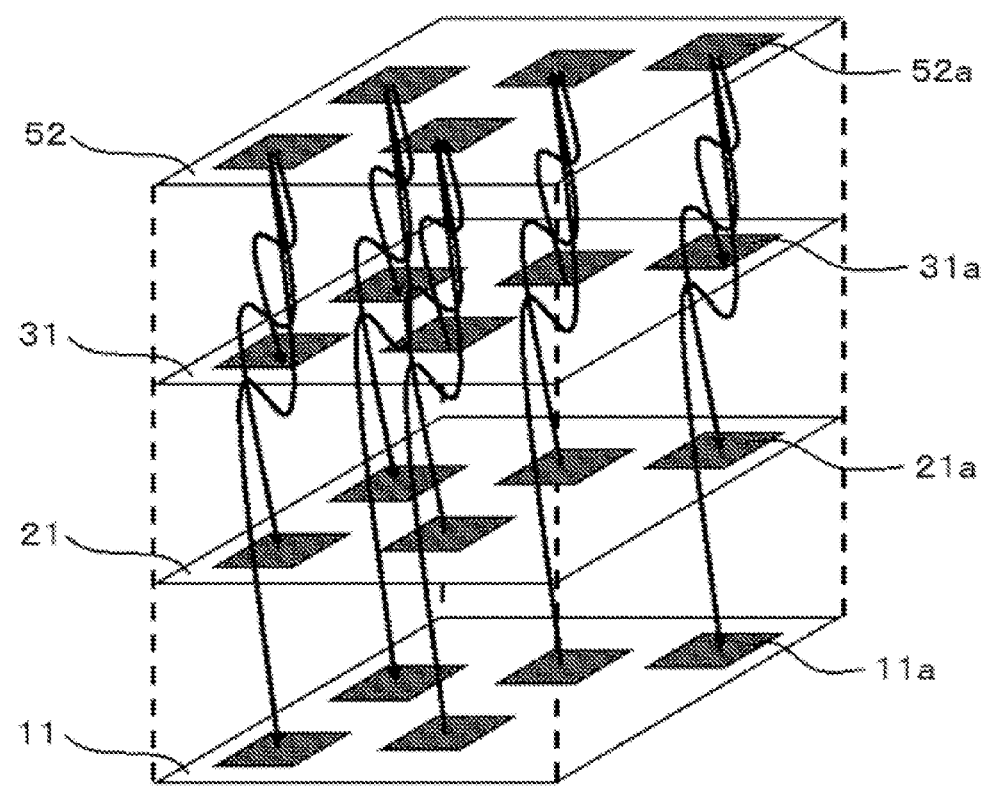
FIG. 5 is a perspective schematically showing the configuration of inspecting chips of the probe card and subject chips of the semiconductor wafers in the semiconductor inspection apparatus relating to Example 1 of the present invention.
Figure 6:
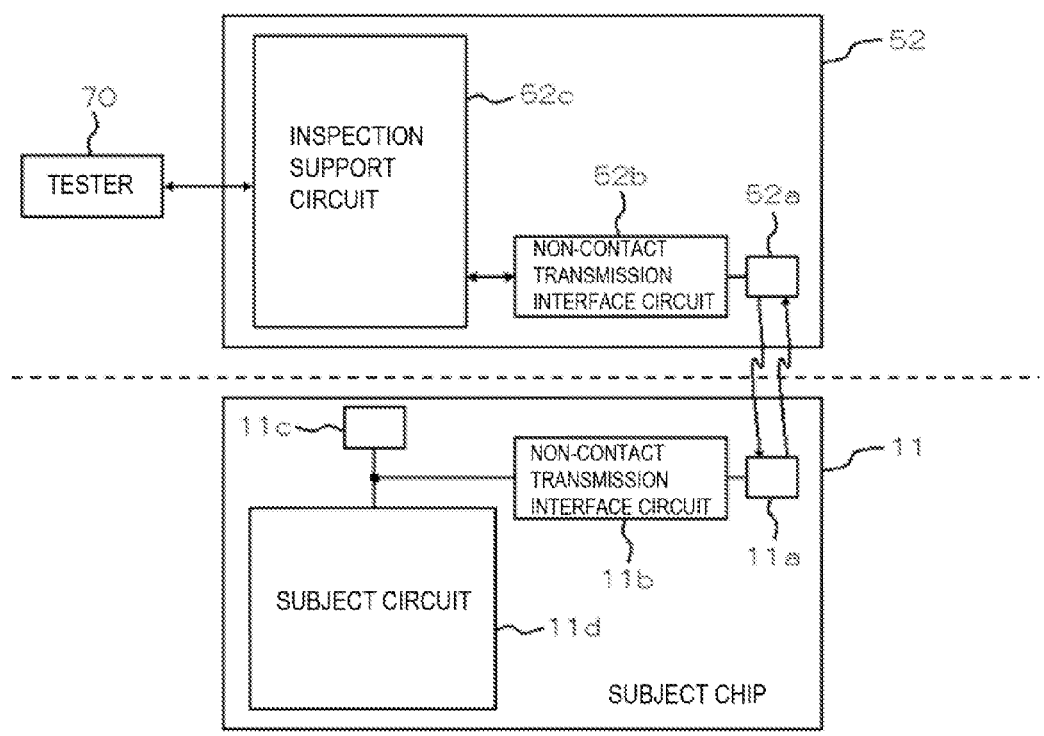
FIG. 6 is a block diagram schematically showing the circuit configurations of the inspecting chip of the probe card and the subject chip of the semiconductor wafer in the semiconductor inspection apparatus relating to Example 1 of the present invention.

Next, the configurations of the probe card and the semiconductor wafers in the semiconductor inspection apparatus relating to Example 1 of the present invention will be described with reference to the drawings. FIGS. 3 and 4 are perspectives schematically showing the configuration of the probe card and the semiconductor wafers in the semiconductor inspection apparatus relating to Example 1 of the present invention. FIG. 5 is a perspective schematically showing the configuration of the inspecting chips of the probe card and the subject chips of the semiconductor wafers in the semiconductor inspection apparatus relating to Example 1 of the present invention. FIG. 6 is a block diagram schematically showing the circuit configurations of the inspecting chip of the probe card and the subject chip of the semiconductor wafer in the semiconductor inspection apparatus relating to Example 1 of the present invention.

With reference to FIG. 3, the first semiconductor wafer 10 comprises a plurality of the subject chips 11. The second semiconductor wafer 20 comprises a plurality of the subject chips 21. The third semiconductor wafer 30 comprises a plurality of the subject chips 31. The probe card 50 comprises a plurality of the inspecting chips 52. By positioning the first semiconductor wafer 10, the second semiconductor wafer 20, the third semiconductor wafer 30, and the probe card 50, an inspecting chip 52 corresponds to a subject chip 11, and an inspecting chip 21 corresponds to a subject chip 31. Note that the sizes of the subject chips 11, 21, and 31 and the inspecting chips 52 do not necessarily have to be the same. Further, the first subject chips 11 of the first semiconductor wafer 10, the second subject chips 21 of the second semiconductor wafer 20, and the third subject chips 31 of the third semiconductor wafer 30 do not necessarily have to be configured identically since there are cases where their functions are partially identical and they partially share inspection vectors. Further, the semiconductor wafers 10, 20, and 30 do not necessarily have to have the same wafer size (refer to FIG. 4).

With reference to FIG. 5, non-contact transmission electrode 52a that performs electrically non-contact transmission of power and a signal is formed on the inspecting chip 52 at a predetermined location. On the subject chip 11, non-contact transmission electrode 11a that performs electrically non-contact transmission of power and a signal is formed at a location corresponding to the location of the non-contact transmission electrode 52a on the inspecting chip 52. On the subject chip 21, non-contact transmission electrode 21a that performs electrically non-contact transmission of power and a signal is formed at a location corresponding to the location of the non-contact transmission electrode 52a on the inspecting chip 52. On the subject chip 31, non-contact transmission electrode 31a that performs electrically non-contact transmission of power and a signal is formed at a location corresponding to the location of the non-contact transmission electrode 52a on the inspecting chip 52. When the inspecting chip 52 corresponds to the subject chips 11, 21, and 31, a non-contact transmission electrode 52a corresponds to a non-contact transmission electrode 11a, a non-contact transmission electrode 21a, and a non-contact transmission electrode 31a. The non-contact transmission electrode 52a is capable of simultaneously transmitting a signal and power to all the non-contact transmission electrodes 11a, 21a, and 31a.

With reference to FIG. 6, the inspecting chip 52 comprises the non-contact transmission electrodes 52a, a non-contact transmission interface circuit 52b, and an inspection support circuit 52c. The non-contact transmission electrode 52a is a communication coil that performs electrically non-contact transmission of power and a signal to the non-contact transmission electrode 11a (and the non-contact transmission electrodes 21a and 31a in FIG. 5). The non-contact transmission interface circuit 52b is a circuit that converts the transmission formats of power and a signal outputted from the inspection support circuit 52c to the non-contact transmission electrode 52a and also converts the transmission formats of power and a signal outputted from the non-contact transmission electrode 52a to the inspection support circuit 52c. The inspection support circuit 52c is a circuit that supports the inspection on the subject chip 11 (21 and 31 in FIG. 4) performed by the tester 70, performs predetermined processing on a signal from the tester 70 and outputs the resultant signal to the non-contact transmission interface circuit 52b, and performs predetermined processing on a signal from the non-contact transmission interface circuit 52b and outputs the resultant signal to the tester 70.

With reference to FIG. 6, the subject chip 11 comprises the non-contact transmission electrodes 11a, a non-contact transmission interface circuit 11b, a pad 11c, and a subject circuit 11d. The non-contact transmission electrode 11a is a communication coil that performs electrically non-contact transmission of power and a signal to the non-contact transmission electrode 52a. The non-contact transmission interface circuit 11b is a circuit that converts the transmission formats of power and a signal outputted from the subject circuit 11d to the non-contact transmission electrode 11a and also converts the transmission formats of power and a signal outputted from the non-contact transmission electrode 11a to the subject circuit 11d. The pad 11c is an input/output electrode pad of the subject circuit 11d. The subject circuit (circuit to be tested) 11d is a circuit that becomes the subject of inspection and receives/outputs a signal and power between the non-contact transmission interface circuit 11b and the pad 11c.

Figure 7:
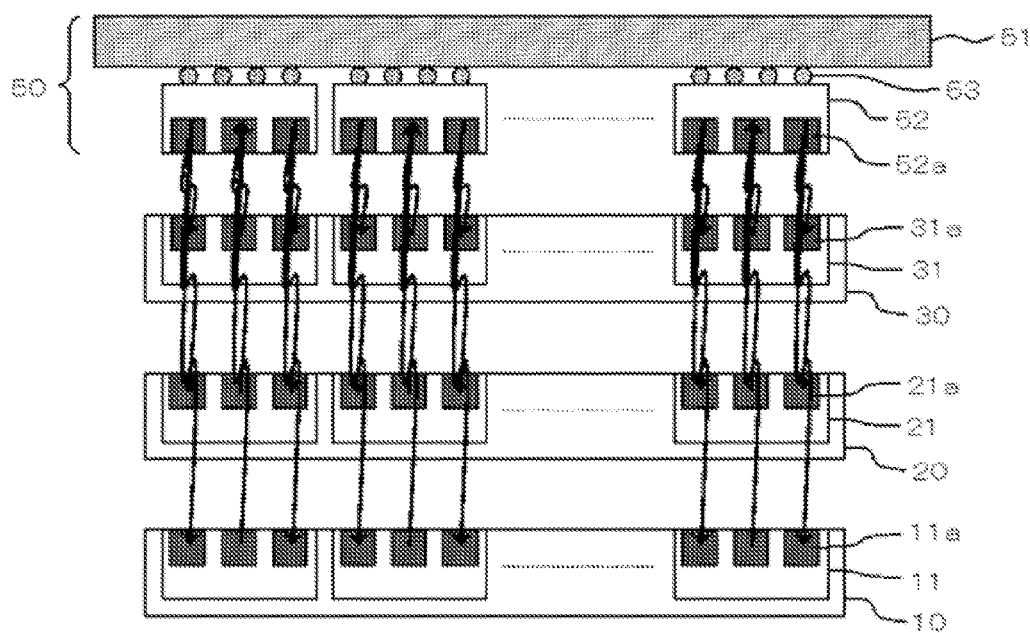
FIG. 7 is a cross-section schematically showing the arrangement of non-contact transmission electrodes of the probe card and the semiconductor wafers in the semiconductor inspection apparatus relating to Example 1 of the present invention.

Next, the arrangement of the non-contact transmission electrodes of the probe card and the semiconductor wafers in the semiconductor inspection apparatus relating to Example 1 of the present invention will be described with reference to the drawings. FIG. 7 is a cross-section schematically showing the arrangement of the non-contact transmission electrodes of the probe card and the semiconductor wafers in the semiconductor inspection apparatus relating to Example 1 of the present invention.

With reference to FIG. 7, the probe card 50 has the inspecting chip 52 flip-chip bonded to a face of a probe card substrate 51 on the side of the first semiconductor wafer 10 via bumps 53, and has the non-contact transmission electrode 52a disposed on a face of the inspecting chip 52 opposite to the side of the probe card substrate 51. The first semiconductor wafer 10 has the non-contact transmission electrode 11a disposed on a face of the first semiconductor wafer 10 on the side of the probe card substrate 51. The second semiconductor wafer 20 has the non-contact transmission electrode 21a disposed on a face of the second semiconductor wafer 20 on the side of the probe card substrate 51. The third semiconductor wafer 30 has the non-contact transmission electrode 31a disposed on a face of the third semiconductor wafer 30 on the side of the probe card substrate 51. Note that the directions (above or below the chip) in which the non-contact transmission electrodes 11a, 21a, 31a, and 52a are disposed may be suitably changed.

Figure 8:
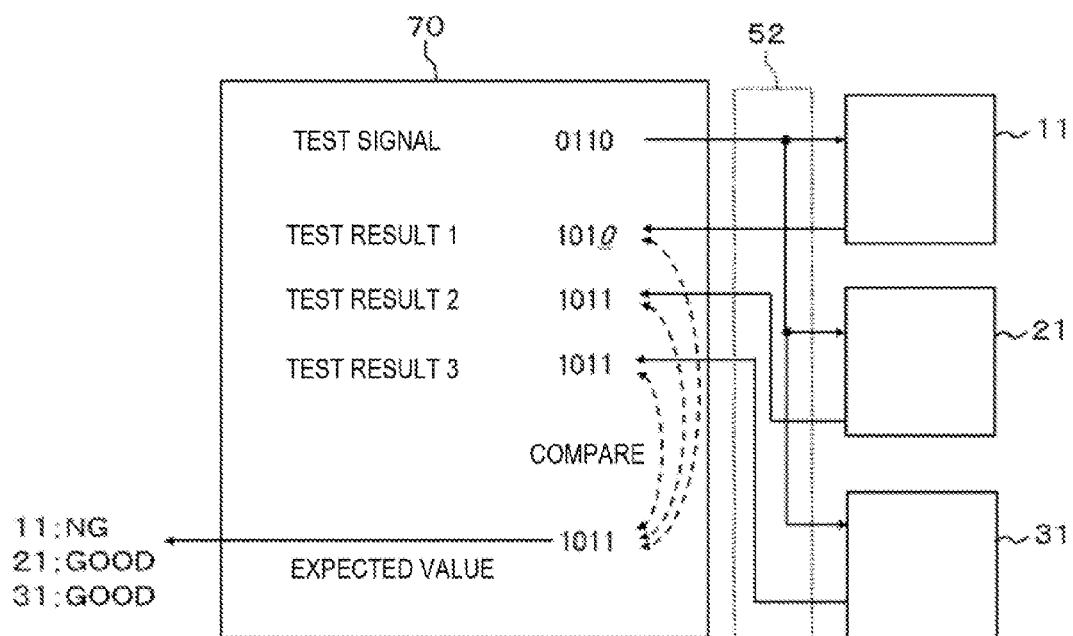
FIG. 8 is a drawing schematically showing an example of the judgment operation of the semiconductor inspection apparatus relating to Example 1 of the present invention.

Next, the judgment operation of the semiconductor inspection apparatus relating to Example 1 of the present invention will be described with reference to the drawings. FIG. 8 is a drawing schematically showing an example of the judgment operation of the semiconductor inspection apparatus relating to Example 1 of the present invention.

First, before the judgment operation is performed, the semiconductor wafers 10, 20, and 30 are set to the semiconductor inspection apparatus 40, and the semiconductor wafers 10, 20, and 30 are positioned (refer to FIG. 1). Note that this positioning includes both horizontal and vertical positioning. The first semiconductor wafer 10 is secured to the first wafer stage 42 by suction, then the first sheet 61 to which the second semiconductor wafer 20 is adhered is placed on the second wafer stage 43, the second semiconductor wafer 20 is roughly positioned against the first semiconductor wafer 10, and the first sheet 61 is secured to the second wafer stage 43 by suction. Then the second sheet 62 to which the third semiconductor wafer 30 is adhered is placed on the second wafer stage 43, the third semiconductor wafer 30 is roughly positioned against the second semiconductor wafer 20, and the second sheet 62 is secured to the third wafer stage 44 by suction. Next, the probe card 50 is set on the third semiconductor wafer 30, and the semiconductor wafers 10, 20, and 30 are positioned against (relative to) the probe card 50 by exerting adjustment of the stages 42, 43, and 44. Here, in this positioning, non-contact transmission electrodes for alignment are provided for the semiconductor wafers 10, 20, and 30 and the probe card 50 in advance, and the stages 42, 43, and 44 are positioned so that the transmitted signal intensity between the non-contact transmission electrode for alignment of the probe card 50 and the non-contact transmission electrodes(s) for alignment of the semiconductor wafers 10, 20, and 30 is maximum. Note that the non-contact transmission electrodes used in normal inspection may act also as the non-contact transmission electrodes for alignment. Then the semiconductor wafers 10, 20, and 30 are inspected. Further, the positioning of the semiconductor wafers 10, 20, and 30 can be performed during the judgment operation, and even when the semiconductor wafers and the probe card expand or contract due to temperature fluctuations during the inspection, their positions can be fine-tuned each time and an accurate judgment can be performed.

In the judgment operation, with reference to FIG. 8, the tester 70 transmits a test signal (for instance "0110") simultaneously to the first subject chip 11, the second subject chip 21, and the third subject chip 31 via the inspecting chip 52 at the start of a test. This means that, in addition to transmitting the test signal to the first subject chip 11, the second subject chip 21, and the third subject chip 31 at the same time, a predetermined test is performed by transmitting a respective appropriate test signal to each of the first subject chip 11, the second subject chip 21, and the third subject chip 31 after the semiconductor wafers 10, 20, and 30 have been set to the semiconductor inspection apparatus 40 and positioned.

Next, after having received the test signal from the tester 70, the first subject chip 11, the second subject chip 21, and the third subject chip 31 launch the test, and transmit the test results (for instance the test result of the first subject chip 11: "1010;" the test result of the second subject chip 21: "1011;" and the test result of the third subject chip 31: "1011") to the tester 70 via the inspecting chip 52.

Next, the tester 70 receives the test results from the first subject chip 11, the second subject chip 21, and the third subject chip 31, and compares the test results to an expected value (for instance an expected value of "1011"). As the result of the comparison, when the test result and the expected value are different, the tester 70 determines that the subject chip corresponding to this test result (the first subject chip 11 in the case of FIG. 8) is "NO GOOD." On the other hand, when the test result matches the expected value, the tester 70 determines that the subject chip corresponding to this test result (the second subject chip 21 and the third subject chip 31 in the case of FIG. 8) is "GOOD." Note that it is possible to have the inspection support circuit (52c in FIG. 6) generate the test signal and/or compare the inspection results to the expected value.

According to Example 1, since the wafer stages 42, 43, and 44 are respectively provided for the semiconductor wafers 10, 20, and 30 and each of the wafer stages is independently capable of relative positioning, the number of chips simultaneously inspected can be increased and the inspection time per chip can be reduced without increasing the number of inspection apparatuses by performing inspection by performing non-contact transmission of a signal between the probe card 50 and the plurality of the semiconductor wafers 10, 20, and 30. As a result, the inspection cost can be reduced. Further, the size of the inspection apparatus per wafer can be reduced. Moreover, it becomes possible to have multichannel test input/output. Further, the positioning of the semiconductor wafers 10, 20, and 30 can be calibrated during inspection. FIG. 1 shows an example in which the wafer stages 42, 43, and 44 are fixed on the base 46 below and the probe card is fixed above, however, the wafer stages 42, 43, and 44 may be fixed on a base above and the probe card may be fixed below.

Example 2

Figure 9:
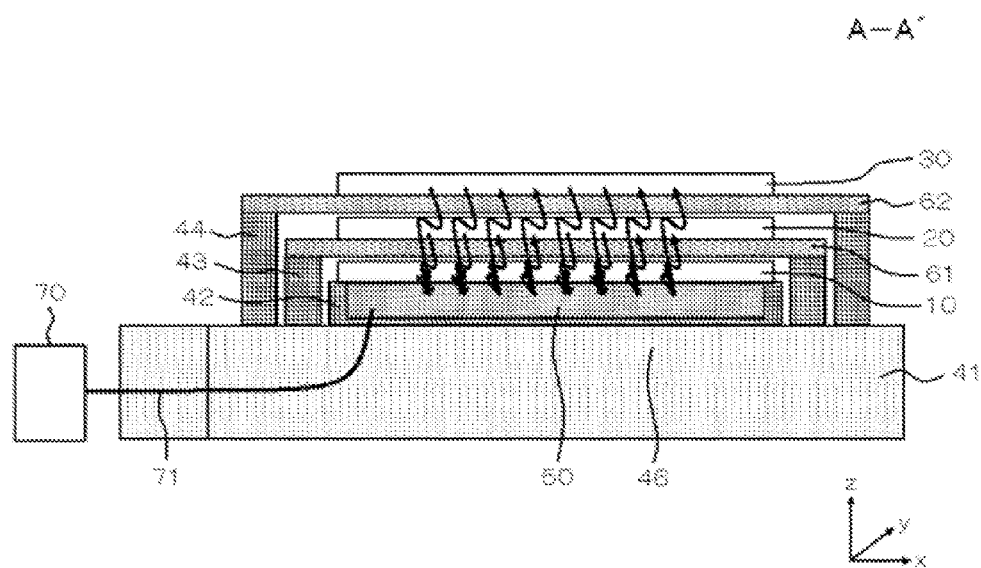
FIG. 9 is a cross-section along line A-A' in FIG. 10, schematically showing the configuration of a semiconductor inspection apparatus relating to Example 2 of the present invention.
Figure 10:
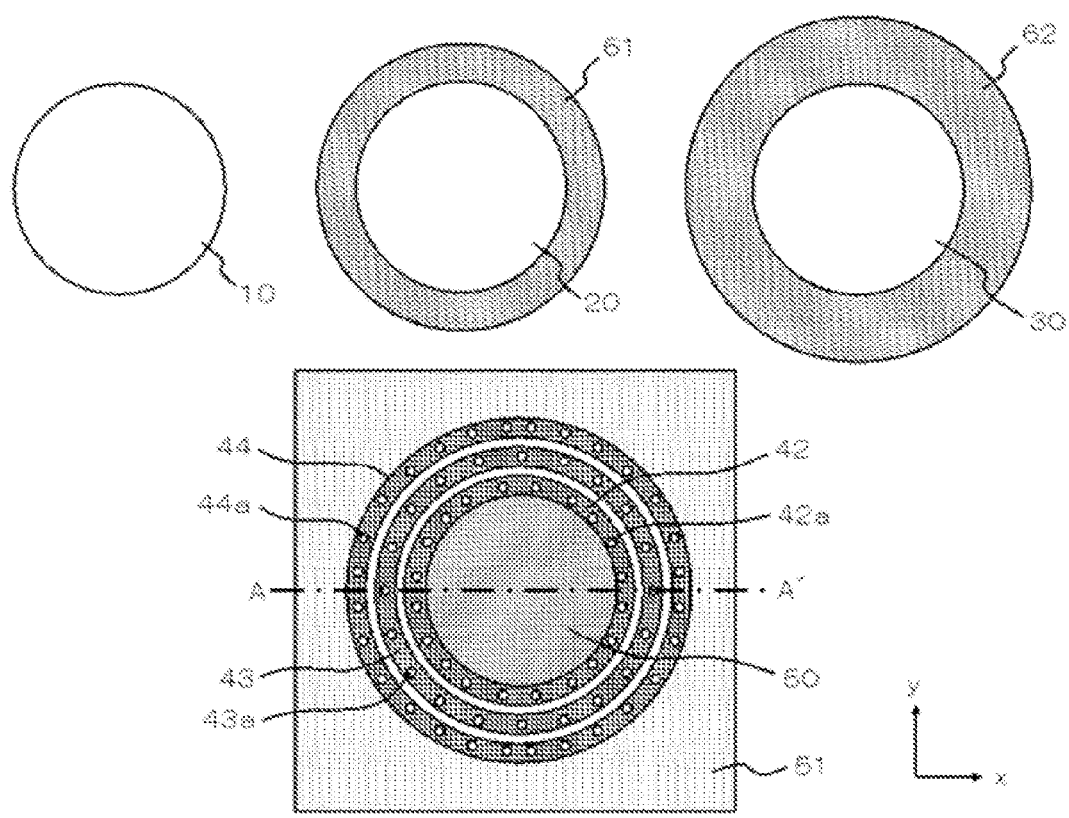
FIG. 10 is a developed plan schematically showing the configuration of the semiconductor inspection apparatus relating to Example 2 of the present invention.

A semiconductor inspection apparatus relating to Example 2 of the present invention will be described with reference to the drawings. FIG. 9 is a cross-section along line A-A' in FIG. 10, schematically showing the configuration of the semiconductor inspection apparatus relating to Example 2 of the present invention. FIG. 10 is a developed plan view schematically showing the configuration of the semiconductor inspection apparatus relating to Example 2 of the present invention.

In Example 1, the probe card (50 in FIG. 1) is disposed above the third semiconductor wafer (30 in FIG. 1), however, in Example 2, the probe card 50 is embedded in the first wafer stage 42 and the head of the prober 41 is eliminated. The configuration and operation of Example 2 are otherwise identical to Example 1.

According to Example 2, the same effects as in Example 1 can be obtained, and the head of the prober 41 does not need to be provided. Further, since the probe card 50 can be independently positioned in addition to the semiconductor wafers, the degree of freedom in positioning the semiconductor wafers and the probe card against (relative to) each other can be increased. As a result, when one wants to keep the positional relations among the semiconductor wafers, but wants to fine-tune the positional relations with the probe card, the semiconductor wafers and the probe card can easily be positioned against each other. Further, FIG. 9 shows an example in which the wafer stages 42, 43, and 44 are fixed on the base 46 below and the probe card is fixed on the wafer stage 42 in the lower level, however, the wafer stages 42, 43, and 44 may be fixed on a base above and the probe card may be fixed on a wafer stage in an upper level. Further, the probe card 50 may be embedded in the wafer stage 42 or a part of the probe card 50 may protrude from the wafer stage 42. According to this configuration, the area of the apparatus can be reduced by an amount of the area of the probe card 50.

Example 3

Figure 11:
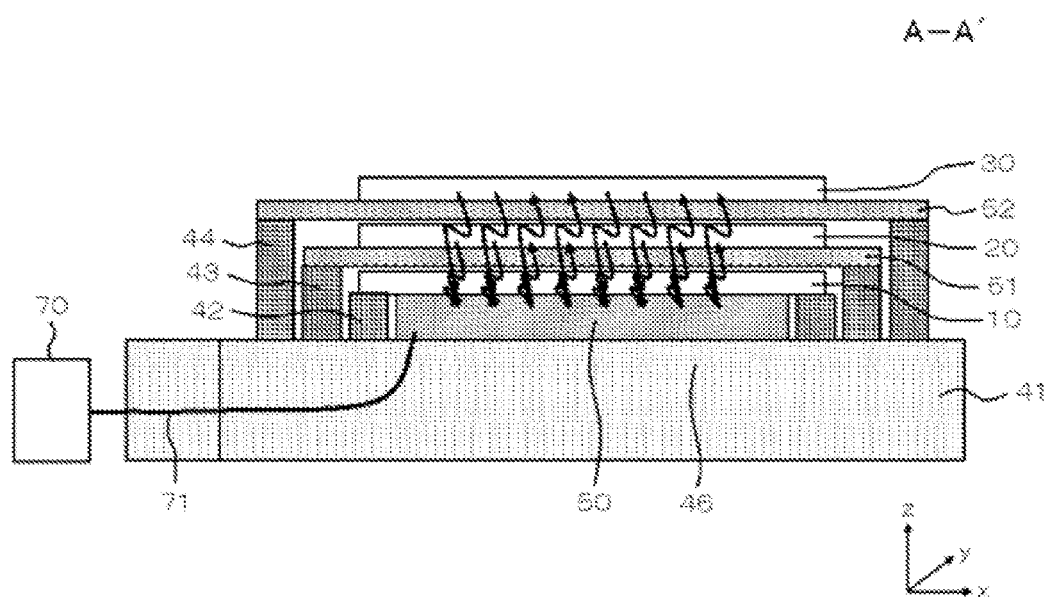
FIG. 11 is a cross-section along line A-A' in FIG. 12, schematically showing the configuration of a semiconductor inspection apparatus relating to Example 3 of the present invention.
Figure 12:
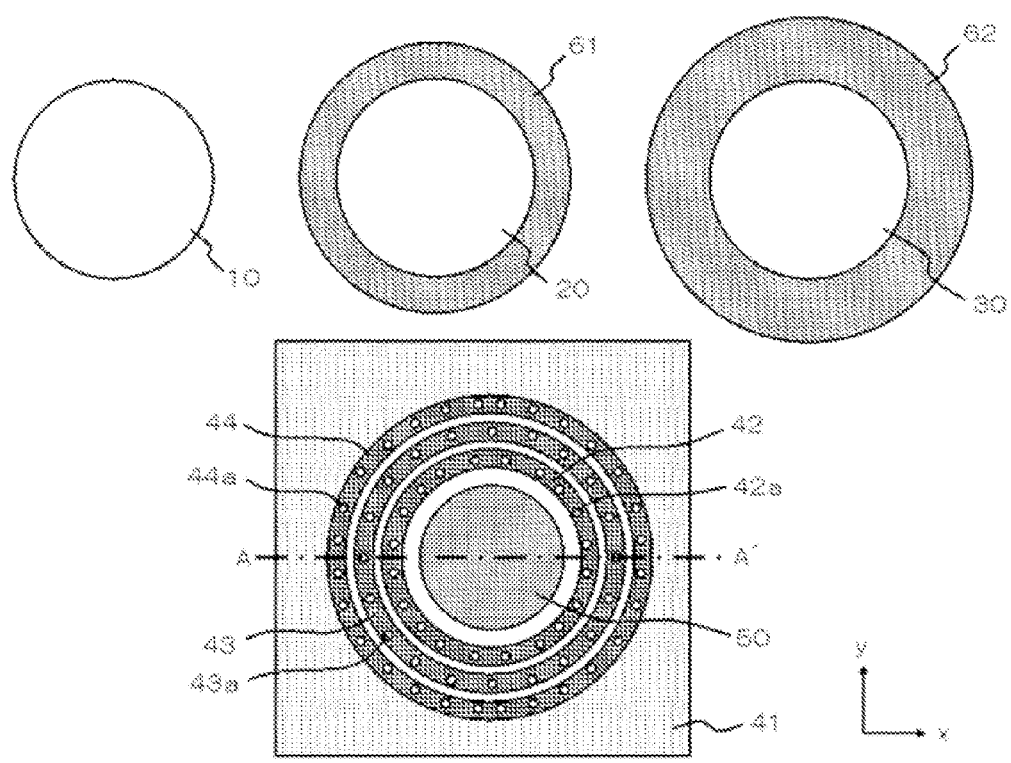
FIG. 12 is a developed plan schematically showing the configuration of the semiconductor inspection apparatus relating to Example 3 of the present invention.

A semiconductor inspection apparatus relating to Example 3 of the present invention will be described with reference to the drawings. FIG. 11 is a cross-section along line A-A' in FIG. 12, schematically showing the configuration of the semiconductor inspection apparatus relating to Example 3 of the present invention. FIG. 12 is a developed plan view schematically showing the configuration of the semiconductor inspection apparatus relating to Example 3 of the present invention.

In Example 2, the probe card (50 in FIG. 9) is embedded in the first wafer stage (42 in FIG. 9), however, in Example 3, the probe card 50 and the first wafer stage 42 are separated and the probe card 50 is disposed inside the first wafer stage 42. The probe card 50 is fixed on the base of the prober 41. The configuration and operation of Example 3 are otherwise identical to Example 2.

According to Example 3, the same effects as in Example 1 can be obtained, and the head of the prober 41 does not need to be provided. Further, FIG. 11 shows an example in which the wafer stages 42, 43, and 44 are fixed on the base 46 below and the probe card is fixed on the base 46 underneath as well, however, the wafer stages 42, 43, and 44 may be fixed on a base above and the probe card may be fixed on the base above as well. According to this configuration, the area of the apparatus can be reduced by an amount of the area of the probe card 50.

Example 4

Figure 13:
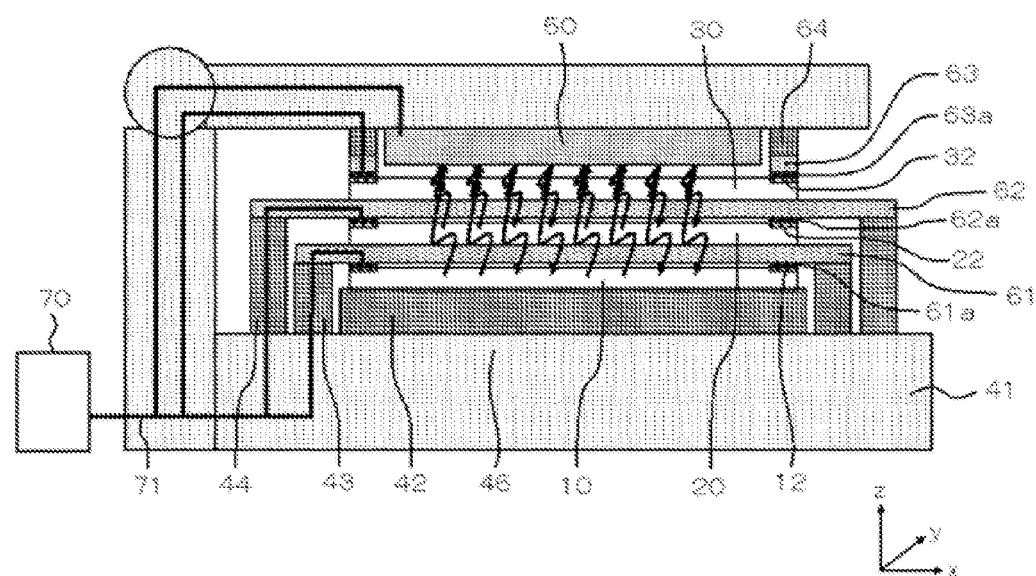
FIG. 13 is a cross-section schematically showing the configuration of a semiconductor inspection apparatus relating to Example 4 of the present invention.

A semiconductor inspection apparatus relating to Example 4 of the present invention will be described with reference to the drawings. FIG. 13 is a cross-section schematically showing the configuration of the semiconductor inspection apparatus relating to Example 4 of the present invention.

In Example 1 (refer to FIG. 1), the transmissions between the probe card (50 in FIG. 1) and the semiconductor wafers (10, 20, and 30 in FIG. 1) are all non-contact, however, in Example 4, power and common signals such as a clock signal are transmitted to each subject chip (11, 21, and 31 in FIG. 3) of the semiconductor wafers 10, 20, and 30 by having electrodes 61a, 62a, and 63a provided on the sheets 61, 62, and 63 contact electrodes 12, 22, and 32 provided on the semiconductor wafers 10, 20, and 30, and other signals are transmitted in a non-contact manner. Example 4 is otherwise configured identically to Example 1.

The first semiconductor wafer 10 comprises an electrode 12 that contacts an electrode 61a of the first sheet 61 in the periphery of a face of the first semiconductor wafer 10 on the side of the probe card 50. The electrode 12 is disposed in a region where the subject chip (11 in FIG. 3) is not disposed and is electrically connected to each subject chip (11 in FIG. 3) via a wiring (not shown in the drawing).

The second semiconductor wafer 20 comprises an electrode 22 that contacts an electrode 62a of the second sheet 62 in the periphery of a face of the second semiconductor wafer 20 on the side of the probe card 50. The electrode 22 is disposed in a region where the subject chip (21 in FIG. 3) is not disposed and is electrically connected to each subject chip (21 in FIG. 3) via a wiring (not shown in the drawing).

The third semiconductor wafer 30 comprises an electrode 32 that contacts an electrode 63a of the third sheet 63 in the periphery of a face of the third semiconductor wafer 30 on the side of the probe card 50. The electrode 32 is disposed in a region where the subject chip (31 in FIG. 3) is not disposed and is electrically connected to each subject chip (31 in FIG. 3) via a wiring (not shown in the drawing). The third semiconductor wafer 30 is larger than the diameter of the probe card 50.

The first sheet 61 comprises the electrode 61a that contacts the electrode 12 of the first semiconductor wafer 10 on a face on the side of the first semiconductor wafer 10. The electrode 61a is electrically connected to the tester 70 via the first sheet 61, the second wafer stage 43, and the wiring 71 disposed in the prober 41. The first sheet 61 and the second wafer stage 43 comprise connection means (not shown in the drawing) such as a connector as a constituent of the wiring 71.

The second sheet 62 comprises the electrode 62a that contacts the electrode 22 of the second semiconductor wafer 20 on a face on the side of the second semiconductor wafer 20. The electrode 62a is electrically connected to the tester 70 via the second sheet 62, the third wafer stage 44, and the wiring 71 in the prober 41. The second sheet 62 and the third wafer stage 44 comprise connection means (not shown in the drawing) such as a connector as a constituent of the wiring 71.

The third sheet 63 is an insulating sheet comprising an electrode 81a that electrically contacts the electrode 32 of the third semiconductor wafer 30. The third sheet 63 is attached to and fixed on a face of an pressing ring (pressing member) 64 on the side of the third semiconductor wafer 30 outside the probe card 50. The third sheet 63 comprises an electrode 63a that contacts the electrode 32 of the third semiconductor wafer 30 on a face on the side of the third semiconductor wafer 30. The electrode 63a is electrically connected to the tester 70 via the third sheet 63, the pressing ring 64, and the wiring 71 in the prober 41.

The pressing ring 64 is a ring-shaped elastic portion that presses the electrode 63a of the third sheet 63 to the electrode 32 of the third semiconductor wafer 30. The pressing ring 64 is fixed on the head of the prober 41 outside the probe card 50.

The third sheet 63 is attached to the face of the interconnection 64 on the side of the third semiconductor wafer 30.

In FIG. 13, the electrode 63a of the third sheet 63 contacts the electrode 63a of the third sheet 63 [sic. the electrode 32 of the third semiconductor wafer 30] in FIG. 13, however, a probe needle may be used instead of the pressing ring 64, the third sheet 63, and the electrode 63a.

According to Example 4, the same effects as in Example 1 can be obtained, power and common signals such as a clock signal can be supplied via the electrode 63a of the third sheet 63, and the number of the non-contact transmission electrodes (11a, 21a, and 31a in FIG. 5) in the subject chips (11, 21, and 31 in FIG. 3) can be reduced. Moreover, it is possible to have the electrodes 61a, 62a, and 63a contact the electrodes 12, 22, 32 in the peripheries of the semiconductor wafers.

Example 5

Figure 14:
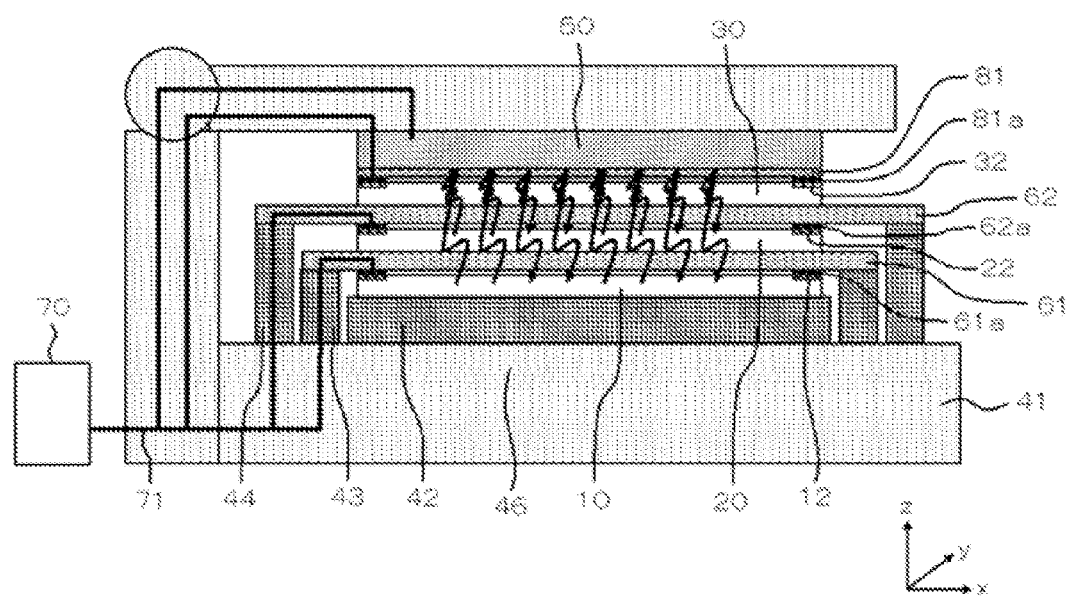
FIG. 14 is a cross-section schematically showing the configuration of a semiconductor inspection apparatus relating to Example 5 of the present invention.

A semiconductor inspection apparatus relating to Example 5 of the present invention will be described with reference to the drawings. FIG. 14 is a cross-section schematically showing the configuration of the semiconductor inspection apparatus relating to Example 5 of the present invention.

In Example 4 (refer to FIG. 13), the pressing ring (64 in FIG. 13) and the third sheet (63 in FIG. 13) are disposed outside the probe card (50 in FIG. 13), and the electrode (63a in FIG. 13) provided on the third sheet (63 in FIG. 13) contacts the electrode (32 in FIG. 13) of the third semiconductor wafer (30 in FIG. 13), however, in Example 5, the pressing ring (64 in FIG. 13) and the third sheet (63 in FIG. 13) are eliminated, the diameter of the probe card 50 is equal to or larger than that of the third semiconductor wafer 30, an insulating sheet 81 is disposed between the probe card 50 and the third semiconductor wafer 30, and an electrode 81a provided on the insulating sheet 81 contacts the electrode 32 of the third semiconductor wafer 30. Example 5 is otherwise configured identically to Example 4.

The insulating sheet 81 is an insulating sheet comprising the electrode 81a that electrically contacts the electrode 32 of the third semiconductor wafer 30. The insulating sheet 81 is attached to and fixed on a face of the probe card 50 on the side of the third semiconductor wafer 30. The insulating sheet 81 comprises the electrode 81a that contacts the electrode 32 of the third semiconductor wafer 30 on a face on the side of the third semiconductor wafer 30. The electrode 81a is electrically connected to the tester 70 via the insulating sheet 81, the probe card 50, and the wiring 71 in the prober 41. The electrodes 32 and 81a can be pressed against each other by having the probe card 50 press the insulating sheet 81 to the third semiconductor wafer 30.

According to Example 5, the same effects as in Example 1 can be obtained, power and common signals such as a clock signal can be supplied via the electrode 81a of the insulating sheet 81, and the number of the non-contact transmission electrodes (11a, 21a, and 31a in FIG. 5) in the subject chips (11, 21, and 31 in FIG. 3) can be reduced.

Example 6

Figure 15:
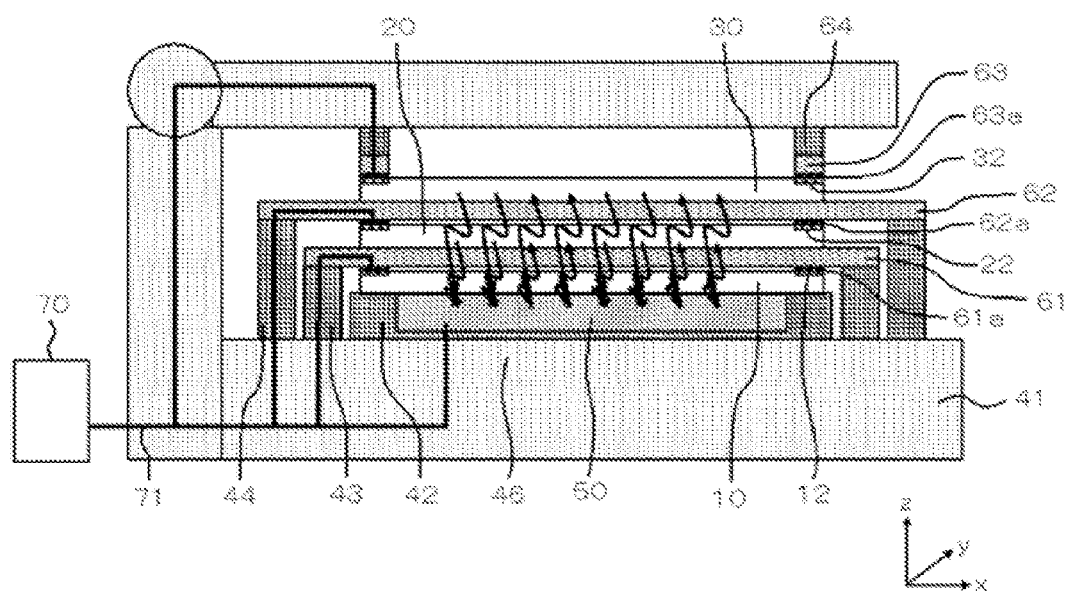
FIG. 15 is a cross-section schematically showing the configuration of a semiconductor inspection apparatus relating to Example 6 of the present invention.

A semiconductor inspection apparatus relating to Example 6 of the present invention will be described with reference to the drawings. FIG. 15 is a cross-section schematically showing the configuration of the semiconductor inspection apparatus relating to Example 6 of the present invention.

In Example 6, the electrical contact in Example 4 (refer to FIG. 13) is applied to the mode in which the probe card 50 is embedded in the first wafer stage 42 as in Example 2 (refer to FIG. 9). In other words, in Example 2, the transmissions between the probe card (50 in FIG. 9) and the semiconductor wafers (10, 20, and 30 in FIG. 9) are all non-contact, however, in Example 6, power and common signals such as a clock signal are transmitted to each subject chip (11, 21, and 31 in FIG. 3) of the semiconductor wafers 10, 20, and 30 by having electrodes 61a, 62a, and 63a provided on the sheets 61, 62, and 63 contact electrodes 12, 22, and 32 provided on the semiconductor wafers 10, 20, and 30, and other signals are transmitted in a non-contact manner. Example 6 is otherwise configured identically to Example 4. As for the configuration of the semiconductor wafers 10, 20, and 30, the sheets 61, 62, and 63, and the pressing ring 64, refer to the descriptions in Example 4.

According to Example 6, the same effects as in Example 1 can be obtained, power and common signals such as a clock signal can be supplied via the electrode 63a of the third sheet 63, and the number of the non-contact transmission electrodes (11a, 21a, and 31a in FIG. 5) in the subject chips (11, 21, and 31 in FIG. 3) can be reduced.

Figure 16:
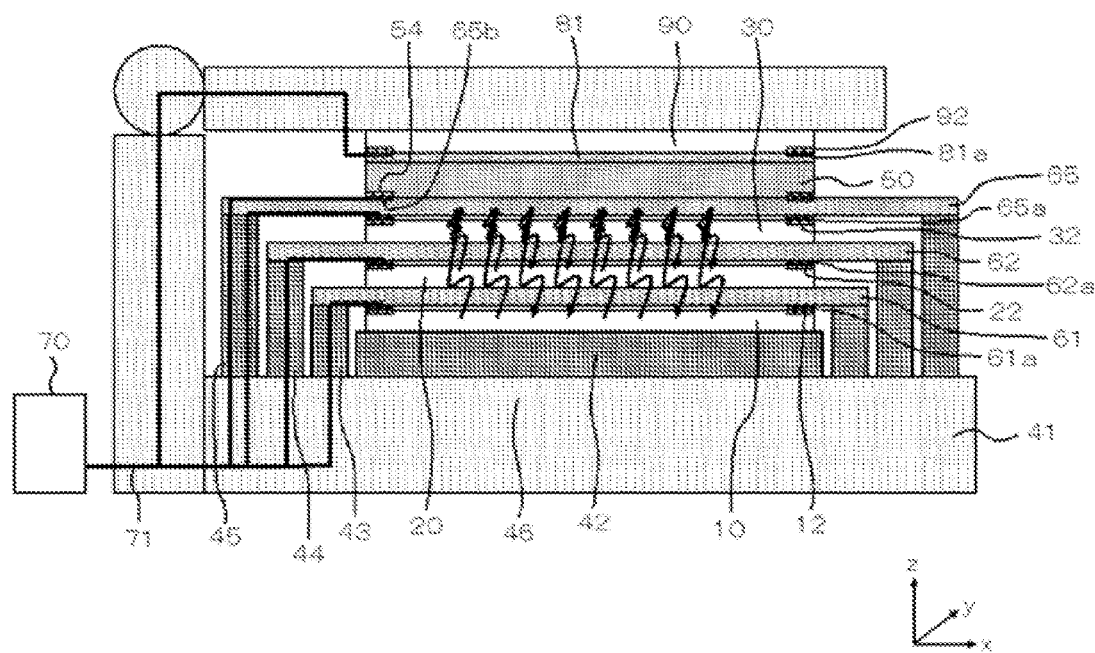
FIG. 16 is a cross-section schematically showing a variation of the configuration of the semiconductor inspection apparatus relating to Example 6 of the present invention.

Further, as shown in FIG. 16, it is possible to dispose a fourth sheet 65 on top of the third semiconductor wafer 30, the probe card 50 on top of the fourth sheet 65, an insulating sheet 81 on the probe card 50, and a fourth semiconductor wafer 90 on top of the insulating sheet 81. In other words, the apparatus can be configured in such a manner that the probe card 50 is disposed between the semiconductor wafers 30 and 90 (or between any adjacent pair out of the semiconductor wafers 10, 20, 30, and 90).

Example 7

Figure 17:
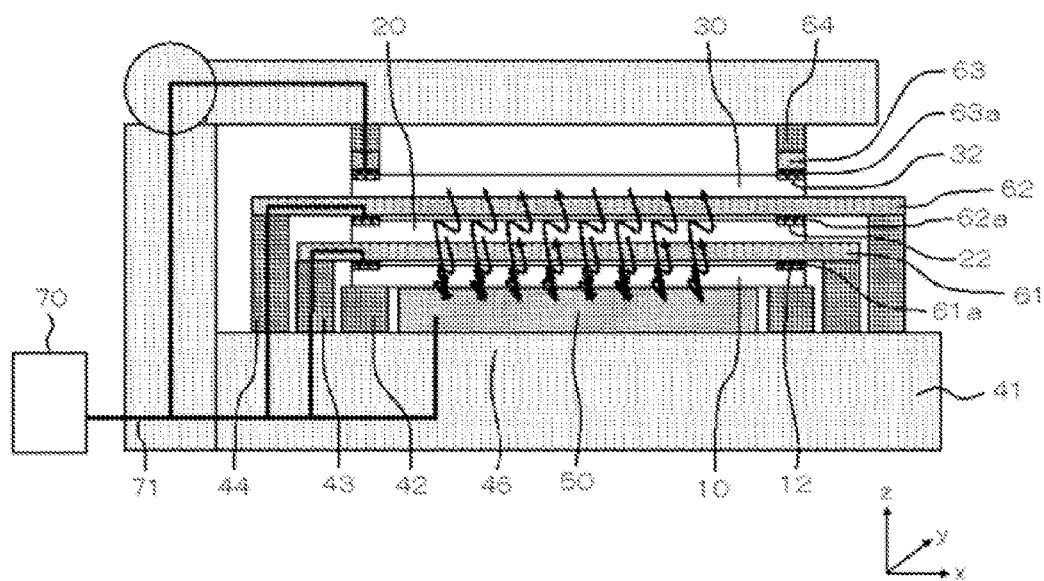
FIG. 17 is a cross-section schematically showing the configuration of a semiconductor inspection apparatus relating to Example 7 of the present invention.

A semiconductor inspection apparatus relating to Example 7 of the present invention will be described with reference to the drawings. FIG. 17 is a cross-section schematically showing the configuration of the semiconductor inspection apparatus relating to Example 7 of the present invention.

In Example 7, the electrical contact in Example 4 (refer to FIG. 13) is applied to the mode in which the probe card 50 is disposed inside the first wafer stage 42 as in Example 3 (refer to FIG. 11). In other words, in Example 3, the transmissions between the probe card (50 in FIG. 11) and the semiconductor wafers (10, 20, and 30 in FIG. 11) are all non-contact, however, in Example 7, power and common signals such as a clock signal are transmitted to each subject chip (11, 21, and 31 in FIG. 3) of the semiconductor wafers 10, 20, and 30 by having electrodes 61a, 62a, and 63a provided on the sheets 61, 62, and 63 contact electrodes 12, 22, and 32 provided on the semiconductor wafers 10, 20, and 30, and other signals are transmitted in a non-contact manner. Example 7 is otherwise configured identically to Example 4. As for the configuration of the semiconductor wafers 10, 20, and 30, the sheets 61, 62, and 63, and the pressing ring 64, refer to the descriptions in Example 4.

According to Example 7, the same effects as in Example 1 can be obtained, power and common signals such as a clock signal can be supplied via the electrode 63a of the third sheet 63, and the number of the non-contact transmission electrodes (11a, 21a, and 31a in FIG. 5) in the subject chips (11, 21, and 31 in FIG. 3) can be reduced.

It should be noted that other objects, features and aspects of the present invention will become apparent in the entire disclosure and that modifications may be done without departing the gist and scope of the present invention as disclosed herein and claimed as appended herewith.

Also it should be noted that any combination of the disclosed and/or claimed elements, matters and/or items may fall under the modifications aforementioned.

What is claimed is:

1. A semiconductor inspection apparatus comprising:
a plurality of wafer stages, provided independently for each of a plurality of laminated semiconductor wafers, that directly or indirect secure said corresponding semiconductor wafers and that possess a mechanism for positioning said corresponding semiconductor wafers; and
a probe card, arranged outside or in between said plurality of laminated semiconductor wafers so as to face said semiconductor wafers, that transmits a signal or power to said plurality of semiconductor wafers,
wherein a plurality of subject chips are formed in said semiconductor wafers; and
said probe card comprises one or more inspecting chips capable of performing non-contact transmission to said subject chips in said semiconductor wafers,
wherein said subject chip includes at least one non-contact transmission electrode that performs non-contact transmission of a signal or power, and
said inspecting chip includes at least one non-contact transmission electrode that performs non-contact transmission of a signal or power to said non-contact transmission electrode of said subject chip.

2. The semiconductor inspection apparatus as defined in claim 1, wherein said non-contact transmission electrode is a communication coil.

3. The semiconductor inspection apparatus as defined in claim 1, comprising:
a sheet to which a predetermined semiconductor wafer of said semiconductor wafers is detachably adhered; wherein
a predetermined wafer stage of said wafer stages is able to secure said sheet thereon.

4. The semiconductor inspection apparatus as defined in claim 3, wherein said sheet is a dicing sheet.

5. The semiconductor inspection apparatus as defined in claim 3, wherein a predetermined wafer stage of said wafer stages is able to secure said sheet thereon by suction.

6. The semiconductor inspection apparatus as defined in claim 1, wherein
said plurality of wafer stages of said semiconductor inspection apparatus are fixed on a common base; and
said probe card is embedded in said wafer stage that secures said semiconductor wafer closest to said base.

7. The semiconductor inspection apparatus as defined in claim 1, wherein
said plurality of wafer stages of said semiconductor inspection apparatus are fixed on a common base; and
said probe card is disposed inside said wafer stage that secures said semiconductor wafer closest to said base.

8. The semiconductor inspection apparatus as defined in claim 1, wherein
said plurality of wafer stages of said semiconductor inspection apparatus are fixed on a common base; and
said wafer stage that supports one of said semiconductor wafers on the side of said base out of two adjacent semiconductor wafers of said plurality of semiconductor wafers of said semiconductor inspection apparatus is disposed inside said wafer stage that supports said other semiconductor wafer.

9. The semiconductor inspection apparatus as defined in claim 3, wherein said semiconductor wafer has a wafer electrode electrically connected to each of said subject chips in a region where said subject chip is not disposed; and
said sheet has a sheet electrode that contacts said wafer electrode at a position where said sheet electrode faces said wafer electrode.

10. A semiconductor inspection apparatus, comprising:
a plurality of wafer stages, provided independently for each of a plurality of laminated semiconductor wafers, that directly or indirectly secure said corresponding semiconductor wafers and that possess a mechanism for positioning said corresponding semiconductor wafers;
a probe card, arranged outside or in between said plurality of laminated semiconductor wafers so as to face said semiconductor wafers, that transmits a signal or power to said plurality of semiconductor wafers; wherein
said semiconductor wafer has a wafer electrode electrically connected to each of subject chips in a region where said subject chip is not disposed;
a sheet having a sheet electrode that contacts said wafer electrode at a position where said sheet electrode faces said wafer electrode; and
a pressing member that presses said wafer electrode of said semiconductor wafer, which is furthest from said base and said sheet electrode contacting said wafer electrode of said semiconductor wafer furthest from said base to the side of said base.

11. The semiconductor inspection apparatus as defined in claim 1, comprising:
an insulating sheet interposed between said probe card and said semiconductor wafer facing each other.

12. The semiconductor inspection apparatus as defined in claim 11, wherein
said semiconductor wafer has a wafer electrode electrically connected to each of said subject chips in a region where said subject chip is not disposed; and
said insulating sheet has a sheet electrode that contacts said wafer electrode at a position where said sheet electrode faces said wafer electrode.

13. The semiconductor inspection apparatus as defined in claim 1, wherein
each of said semiconductor wafers is of the same type as each other.

14. A semiconductor wafer positioning method, comprising:
positioning a plurality of semiconductor wafers laminated with each other and secured by each of a plurality of wafer stages independently capable of positioning relative to a probe card provided outside or in between said plurality of semiconductor wafers so as to face said semiconductor wafers for each of said semiconductor wafers; wherein
said positioning is performed based on non-contact transmission electrodes provided in each of said plurality of semiconductor wafers and in said probe card.

15. A semiconductor wafer inspection method, comprising:
(a) positioning a plurality of semiconductor wafers laminated with each other and secured by each of a plurality of wafer stages independently capable of positioning and a probe card provided outside or in between said plurality of semiconductor wafers so as to face said semiconductor wafers for each of the semiconductor wafers termed as "step (a)";
(b) having said probe card simultaneously transmit an inspection signal to subject chips provided in each of said semiconductor wafers (termed as "step (b)"); and (c) having each of said subject chips that have received said inspection signal simultaneously transmit the respective inspection result to said probe card (termed as "step (c)"); wherein a plurality of subject chips are formed in said semiconductor wafers;

said probe card comprises one or more inspecting chips capable of performing non-contact transmission to said subject chips in said semiconductor wafers;

said subject chip includes at least one non-contact transmission electrode that performs non-contact transmission of a signal or power; and said inspecting chip includes at least one non-contact transmission electrode that performs non-contact transmission of a signal or power to said non-contact transmission electrode of said subject chip; and said step (b) and said step (c) are performed with non-contact transmission between an inspecting chip provided in said probe card and said subject chips.

16. A semiconductor apparatus manufacturing method, comprising:

positioning a plurality of semiconductor wafers laminated with each other and secured by each of a plurality of wafer stages independently capable of positioning relative to a probe card provided outside or in between said plurality of semiconductor wafers so as to face said semiconductor wafers for each of said semiconductor wafers; wherein said positioning is performed based on non-contact transmission electrodes provided in each of said plurality of semiconductor wafers and in said probe card.

* * * * *